(12) United States Patent
Chen

(10) Patent No.: US 11,984,530 B2
(45) Date of Patent: May 14, 2024

(54) LIGHT EMITTING DIODE STRUCTURE

(71) Applicant: CHONGQING KONKA PHOTOELECTRIC TECHNOLOGY RESEARCH INSTITUTE CO., LTD., Chongqing (CN)

(72) Inventor: Ching-Chung Chen, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 495 days.

(21) Appl. No.: 17/235,729

(22) Filed: Apr. 20, 2021

(65) Prior Publication Data
US 2021/0249560 A1 Aug. 12, 2021

Related U.S. Application Data

(63) Continuation of application No. PCT/CN2019/120847, filed on Nov. 26, 2019.

(51) Int. Cl.
H01L 33/06 (2010.01)
H01L 33/12 (2010.01)
(Continued)

(52) U.S. Cl.
CPC ............. H01L 33/06 (2013.01); H01L 33/12 (2013.01); H01L 33/20 (2013.01); H01L 33/32 (2013.01)

(58) Field of Classification Search
CPC ......... H01L 33/06; H01L 12/20; H01L 12/32; H01L 12/0075; H01L 33/12; H01L 33/20; H01L 33/32; H01L 33/0075
See application file for complete search history.

(56) References Cited

U.S. PATENT DOCUMENTS

| 10,825,951 B2 | 11/2020 | Lee et al. |
| 2005/0056850 A1* | 3/2005 | Taki ................. H01L 33/32 257/79 |
| 2009/0014713 A1 | 1/2009 | Kang et al. |

FOREIGN PATENT DOCUMENTS

| CN | 101506937 A | 8/2009 |
| CN | 102332515 A | 1/2012 |
(Continued)

OTHER PUBLICATIONS

International Search Report issued in corresponding International Application No. PCT/CN2019/120847, dated Aug. 27, 2020, pp. 1-10, Beijing, China.
(Continued)

Primary Examiner — Walter H Swanson
Assistant Examiner — Jacob T Nelson
(74) Attorney, Agent, or Firm — HAUPTMAN HAM, LLP

(57) ABSTRACT

A light emitting diode (LED) structure includes a substrate, a first type semiconductor layer, a second type semiconductor layer, and a multi-quantum well light-emitting layer. The first type semiconductor layer is disposed on the substrate and has a patterned structure layer on a surface of the first type semiconductor layer away from the substrate. The multi-quantum well light-emitting layer is sandwiched between the patterned structure layer and the second type semiconductor layer and covers the patterned structure layer. The multi-quantum well light-emitting layer has multiple first thickness regions, multiple second thickness regions, and multiple transition regions. The first thickness region has a thickness greater than the second thickness region in a vertical direction from the first type semiconductor layer to the second type semiconductor layer. The transition region
(Continued)

has a thickness that gradually decreases in a direction from the first thickness regions to the second thickness region.

20 Claims, 4 Drawing Sheets

(51) Int. Cl.
  *H01L 33/20* (2010.01)
  *H01L 33/32* (2010.01)

(56) References Cited

FOREIGN PATENT DOCUMENTS

| | | | |
|---|---|---|---|
| CN | 102460741 A | | 5/2012 |
| CN | 102822995 A | | 12/2012 |
| CN | 103887382 A | | 6/2014 |
| CN | 105428486 A | * | 3/2016 |
| CN | 105428486 A | | 3/2016 |
| CN | 105762241 A | | 7/2016 |
| CN | 107316922 A | | 11/2017 |
| CN | 107731977 A | * | 2/2018 ......... H01L 33/0075 |
| CN | 107731977 A | | 2/2018 |
| CN | 108110100 A | | 6/2018 |
| CN | 110494992 A | | 11/2019 |
| JP | 2009059851 A | | 3/2009 |

OTHER PUBLICATIONS

The first office action issued in corresponding CN application No. 201980004373.7 dated Dec. 3, 2021.

* cited by examiner

LIGHT EMITTING DIODE STRUCTURE

CROSS-REFERENCE TO RELATED APPLICATION(S)

This application is a continuation of International Application No. PCT/CN2019/120847, filed on Nov. 26, 2019, which is hereby incorporated by reference in its entirety.

TECHNICAL FIELD

The present disclosure relates to a diode, and particularly to a light emitting diode (LED) structure.

BACKGROUND

Light-emitting diodes (LED) have been widely used as indicator lights or light sources in household appliances and various instruments due to their advantages of long service life, small size, high shock resistance, low heat generation, low power consumption, and the like.

Generally, a wafer structure of the LED includes a substrate, a first type semiconductor layer formed on the substrate, a second type semiconductor layer, and a light-emitting layer sandwiched between the first type semiconductor layer and the second type semiconductor layer. The light-emitting layer is also implemented as a multi-quantum well (MQW) structure to increase the brightness of the LED. However, there are still limitations in increasing the brightness of the MQW structure, for example, the brightness can be improved by increasing the thickness or area of the MQW structure, but a large thickness will cause a decrease in the internal quantum efficiency (IQE).

SUMMARY

In view of above, an LED structure with high luminous brightness and high internal quantum efficiency is desired to address the above-mentioned problems.

A LED structure is provided. The LED structure includes a substrate, a first type semiconductor layer, a second type semiconductor layer, and a multi-quantum well light-emitting layer. The first type semiconductor layer is disposed on the substrate. The first type semiconductor layer has a patterned structure layer on a surface of the first type semiconductor layer away from the substrate. The multi-quantum well light-emitting layer is sandwiched between the patterned structure layer and the second type semiconductor layer and covers the patterned structure layer. The multi-quantum well light-emitting layer has multiple first thickness regions, multiple second thickness regions, and multiple transition regions, each of the multiple transition regions is connected between a corresponding one of the multiple first thickness regions and a corresponding one of the multiple second thickness regions. The multiple first thickness regions and the multiple second thickness regions are alternately arranged. Each of the multiple first thickness regions has a thickness greater than each of the multiple second thickness regions in a vertical direction from the first type semiconductor layer to the second type semiconductor layer. Each of the multiple transition regions has a thickness that gradually decreases in a direction from a corresponding one of the multiple first thickness regions to a corresponding one of the multiple second thickness regions.

Different from a LED structure in the rerated art with a light-emitting layer having the same thickness throughout, the LED structure of the present disclose combines the patterned structure layer with variation in thickness differences among the first thickness region, the transition region, and the second thickness region, such that the luminous brightness of the LED structure is improved by allowing the first thickness region to have a large thickness, and the internal extraction efficiency is ensured by allowing the second thickness region to have a small thickness.

In an implementation, the thickness of each of the multiple first thickness regions is at least twice that of each of the multiple the second thickness regions.

In an implementation, the thickness of each of the multiple first thickness regions is at least 5.5 times that of each of the multiple the second thickness regions.

In an implementation, the thickness of each of the multiple transition regions decreases linearly in the direction from the corresponding one of the multiple first thickness regions to the corresponding one of the multiple second thickness regions.

In an implementation, the multiple first thickness regions are close to a bottom of the patterned structure layer, the multiple the second thickness regions are close to a top of the patterned structure layer.

In an implementation, the patterned structure layer includes multiple cones. Each of the multiple first thickness regions is located between two adjacent cones. The multiple cones cooperate to form multiple peaks and valleys. Each of the multiple second thickness regions is located at the peak of a corresponding one of the multiple cones, where the peak is close to the second type semiconductor layer.

In an implementation, each of the multiple second thickness regions of the multi-quantum well light-emitting layer is spaced apart from the peak of a corresponding one of the multiple cones at one side of the second thickness region that is away from the patterned structure layer.

In an implementation, the peak of each of the multiple cones is pointed. Each of the multiple second thickness regions is pointed.

In an implementation, the peak of each of the multiple cones is flat. Each of the multiple second thickness regions of the multi-quantum well light-emitting layer is flat.

In an implementation, a surface of each of the multiple first thickness regions away from the patterned structure layer and a surface of a corresponding one of the multiple transition regions away from the patterned structure layer cooperate to define a depression toward the patterned structure layer.

In an implementation, the depression of the multi-quantum well light-emitting layer has a V-shaped cross section.

In an implementation, the depression of the multi-quantum well light-emitting layer has an arc-shaped cross section.

In an implementation, the second type semiconductor layer has protrusions at positions corresponding to the depressions of the multi-quantum well light-emitting layer.

In an implementation, a surface of each of the multiple first thickness regions away from the patterned structure layer and a surface of a corresponding one of the multiple transition regions away from the patterned structure layer cooperate to form a flat surface.

In an implementation, the multi-quantum well light-emitting layer has a cross section in part in a triangular shape.

In an implementation, the first type semiconductor layer is made of N-type gallium nitride, the second type semiconductor layer is made of P-type gallium nitride.

In an implementation, the LED structure further includes a buffer layer sandwiched between the substrate and the first type semiconductor layer. The buffer layer is made of undoped N-type gallium nitride.

In an implementation, the LED structure further includes a transparent conductive layer covering the second type semiconductor layer.

In an implementation, the transparent conductive layer is made of indium tin oxide.

In an implementation, the substrate is made of aluminum oxide.

DETAILED DESCRIPTION OF ILLUSTRATED IMPLEMENTATIONS

In order to facilitate the understanding of the present disclosure, the present disclosure will be more fully described below with reference to the accompanying drawings. Only preferred implementations of the present disclosure are illustrated in the accompanying drawings. However, the present disclosure can be implemented in various different implementations and is not limited to the implementations described herein. Rather, these implementations are provided for more thorough and complete understanding of the present disclosure.

It is noted that, when an element is referred to as being "fixed to" another element, the element is either directly on another element, or intervening element(s) may also be present. When an element is referred to as being "connected with" another element, the element is either directly connected with another element, or intervening element(s) may also be present. In addition, the term "and/or" herein only describes an association relationship between associated objects, which means that there can be three relationships. For example, A and/or B can mean A alone, both A and B exist, and B alone.

Unless defined otherwise, all technical and scientific terms used herein have the same meaning as commonly understood by those skilled in the art of the present disclosure. The terms used in the specification of the present disclosure herein are only for the purpose of describing specific implementations, for example, "inner", "outer", "left", "right", and similar expressions are for illustrative purposes only and are not intended to limit the present disclosure.

Figure 1:
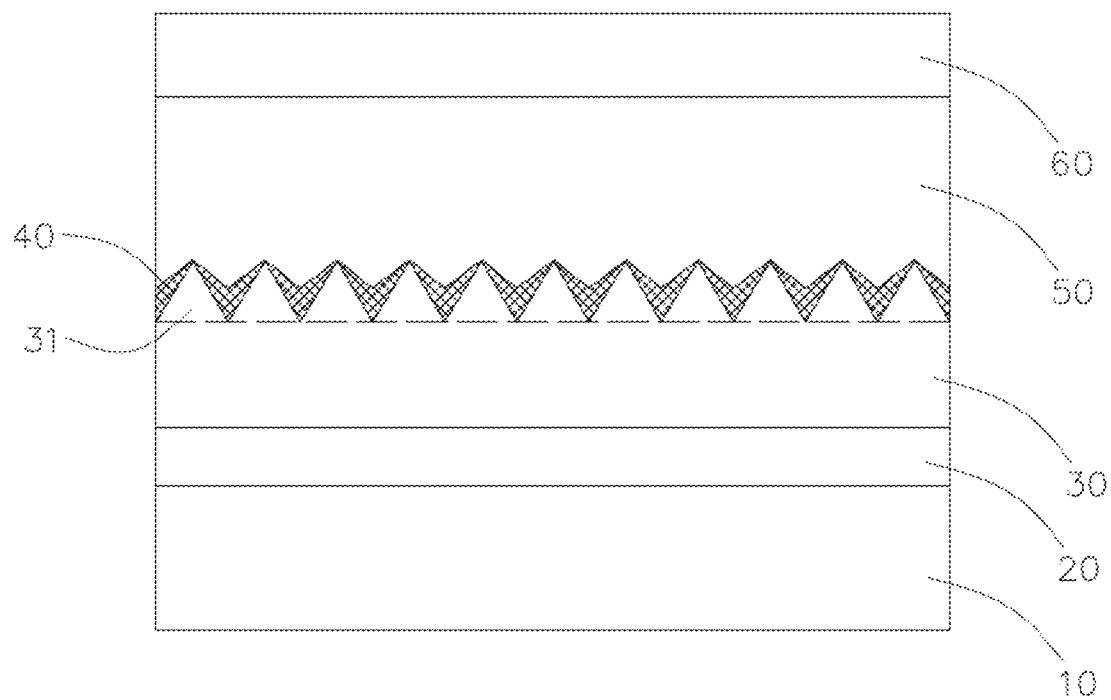
FIG. 1 is a schematic cross-sectional view of a LED structure according to an implementation of the present disclosure.
Figure 2:
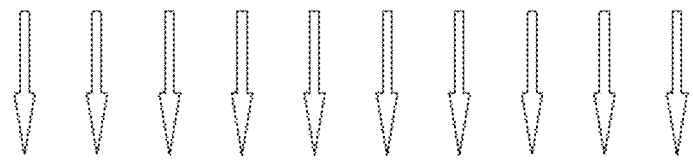
FIG. 2 is a schematic diagram illustrating generation of a MQW light-emitting layer of the LED structure illustrated in FIG. 1 through vaporization doping.
Figure 2:
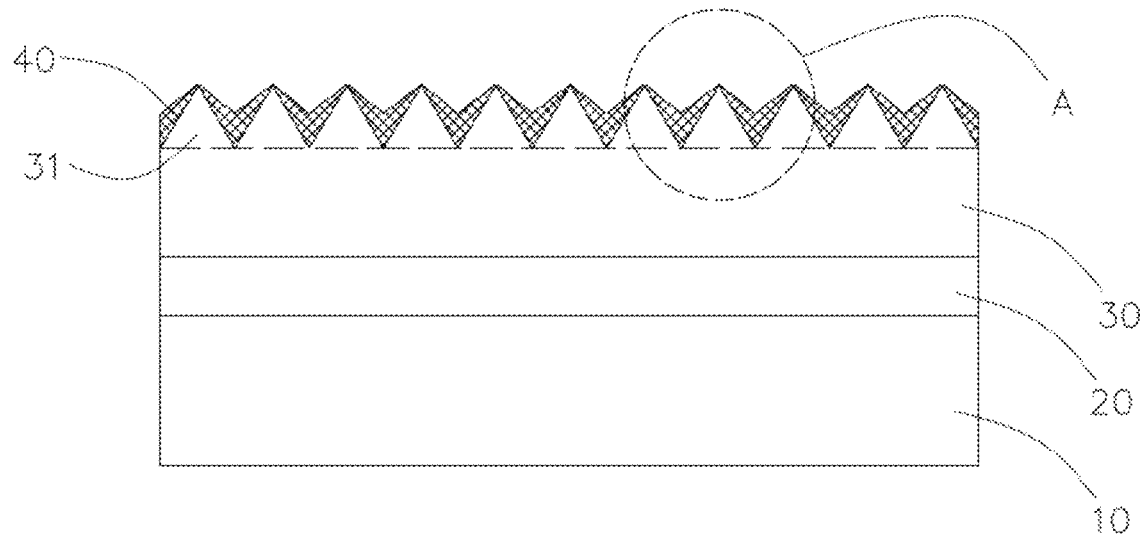
Figure 3:
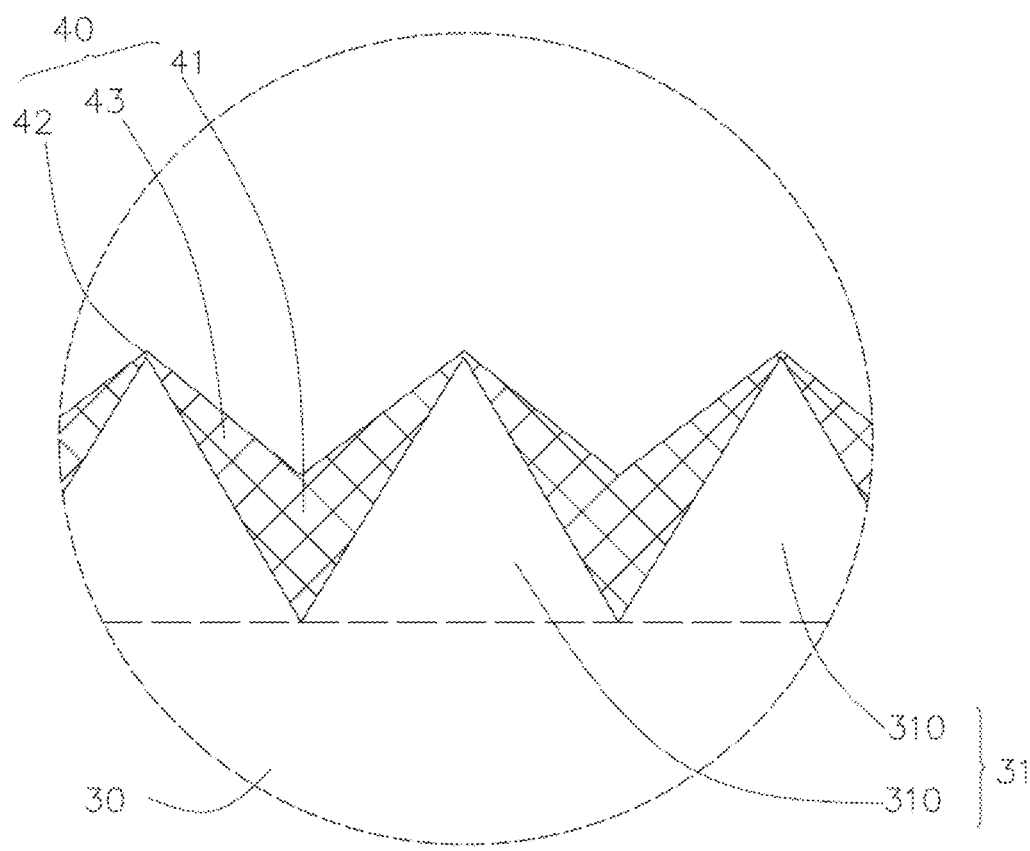
FIG. 3 is an enlarged view of part of structures of the patterned structure layer and the multi-quantum well light-emitting layer in circle A of the LED structure illustrated in FIG. 2.

FIG. 1 to FIG. 3 illustrate partial cross-sectional views of a LED structure according to an implementation of the present disclosure. The LED structure includes a substrate 10, a buffer layer 20, a first type semiconductor layer 30, a multi-quantum well (MQW) light-emitting layer 40, a second type semiconductor layer 50, and a transparent conductive layer 60. The first type semiconductor layer 30 has a patterned structure layer 31 on a surface of the first type semiconductor layer 30 away from the substrate 10. The MQW light-emitting layer 40 is sandwiched between the patterned structure layer 31 and the second type semiconductor layer 50 and covers the patterned structure layer 31.

The substrate 10 may be made of materials such as sapphire, silicon carbide (SiC), zinc oxide (ZnO), silicon (Si) substrate, gallium phosphide (GaP), gallium arsenide (GaAs), aluminum oxide ($Al_2O_3$), or others materials. In the present disclosure, the substrate is made of aluminum oxide. When the substrate 10 is made of $Al_2O_3$, it facilitates a manufacture of an entire device through an epitaxial growth technology, thereby simplifying the entire manufacturing process and reducing equipment costs.

The buffer layer 20 is also called a cladding layer or a transition layer. The buffer layer 20 serves as a transition for forming the first type semiconductor layer 30 on the substrate 10. The buffer layer 20 is made of the same material as the first type semiconductor layer 30. As an option, in the present disclosure, the first type semiconductor layer 30 is made of N-type gallium nitride, and correspondingly, the buffer layer 20 is made of N-type gallium nitride. Further, the buffer layer 20 is made of undoped N-type gallium nitride.

As illustrated in FIG. 1, the patterned structure layer 31 of the first type semiconductor layer 30 is made of the same material as the first type semiconductor layer 30. Both the patterned structure layer 31 and the first type semiconductor layer 30 are made of N-type gallium nitride. The patterned structure layer 31 includes multiple cones 310. The multiple cones 310 cooperate to form multiple peaks and valleys. That is, the patterned structure layer 31 has multiple peaks and valleys. An inclined surface is formed between a peak and a valley adjacent to the peak. Light beams generated by the MQW light-emitting layer 40 can be effectively reflected by the inclined surface of the cone 310 to be directed towards the second type semiconductor layer 50 and the transparent conductive layer 60.

The MQW light-emitting layer 40 is located between the patterned structure layer 31 and the second type semiconductor layer 50. In this implementation, the MQW light-emitting layer 40 is formed to cover the patterned structure layer 31 by vaporization doping, so that the MQW light-emitting layer 40 is stacked on the patterned structure layer 31 and achieves a desired thickness variation. The MQW light-emitting layer 40 has multiple first thickness regions 41, multiple second thickness regions 42, and multiple transition regions 43. The transition region 43 is connected between the first thickness region and the second thickness region 42 adjacent to the first thickness region 41. The multiple first thickness regions 41 and the multiple second thickness regions 42 are alternately arranged. The first thickness region 41 has a thickness greater than the second thickness region 42 in a vertical direction from the first type semiconductor layer 30 to the second type semiconductor layer 50. The transition region 46 has a thickness that gradually decreases in a direction from the first thickness region 41 to the second thickness region 42. In an implementation, the thickness of the first thickness region 41 is at least twice that of the second thickness regions 42, so as to achieve a greater range of variation in the thickness differences among the first thickness region 41, the transition region 43, and the second thickness region 42. In an implementation, the thickness of the first thickness region 41 is at least 5.5 times that of the second thickness region 42. The thickness of the transition region 43 decreases linearly (that is, uniformly) in the direction from the first thickness region 41 to the second thickness region 42. In this implementation, the thickness of the second thickness region 42 is extremely thin, and is much smaller than the thickness of the first thickness region 41. In addition, a side of the second thickness region 42 away from the patterned structure layer 31 is very close to the peak of the cone 310. In this way, the second thickness region 42 is designed to be extremely thin, such that structures of the MQW light-emitting layer 40 have various thicknesses from the second thickness region 42 and the transition region 43, and the internal extraction efficiency (IQE) is improved.

As illustrated in FIG. 3, in this implementation, in the MQW light-emitting layer 40, a surface of the first thickness region 41 away from the patterned structure layer 31 and a surface of the transition region 43 away from the patterned structure layer 31 cooperate to define a depression toward the patterned structure layer 31. Further, the depression of the MQW light-emitting layer 40 has a V-shaped cross section, so as to ensure that the thickness of the transition region 43 decreases linearly in the direction from the first thickness region 41 to the second thickness region 42, and has a smooth thickness variation. The first thickness region 41 is located at the valley between the two cones 310. The second thickness region 42 is located at the peak of the cone 310.

The second type semiconductor layer 50 overlies the MQW light-emitting layer 40. The second type semiconductor layer 50 is formed of P-type gallium nitride. In this implementation, since the surface of the first thickness region 41 away from the patterned structure layer 31 and the surface of the transition region 43 away from the patterned structure layer 31 cooperate to define the depression toward the patterned structure layer 31, the second type semiconductor layer 50 has protrusions at positions corresponding to the depressions of the MQW light-emitting layer 60.

The transparent conductive layer 60 overlies the second type semiconductor layer 50. The transparent conductive layer 60 is made of indium tin oxide.

When applying an appropriate voltage to the LED structure of the present disclosure, the MQW light-emitting layer 40 emits light beams, the second type semiconductor layer 50 and the transparent conductive layer 60 allow the light beams to pass through to be directed towards the outside. A part of the light beams emitted from the first thickness region 41 with a large thickness is allowed to directly pass through the second type semiconductor layer 50 and the transparent conductive layer 60 to be directed towards the outside, another part of the light beams emitted from the first thickness region 41 is reflected by the patterned structure layer 31 and then allowed to pass through the second type semiconductor layer 50 and the transparent conductive layer 60, and thus the brightness of the LED structure is improved. At the same time, a small thickness of the second thickness region 41 and the transition region 43 close to the second thickness region 41 allows an ability of converting injected electric energy into light energy to be improved, thereby improving the IQE. Different from a LED structure in the rerated art with a light-emitting layer having the same thickness throughout, the LED structure of the present disclose combines the patterned structure layer 31 with variation in thickness differences among the first thickness region 41, the transition region 43, and the second thickness region 42, such that the luminous brightness of the LED structure is improved by allowing the first thickness region 41 to have a large thickness, and the IQE is ensured by allowing the second thickness region 42 to have a small thickness.

Figure 4:
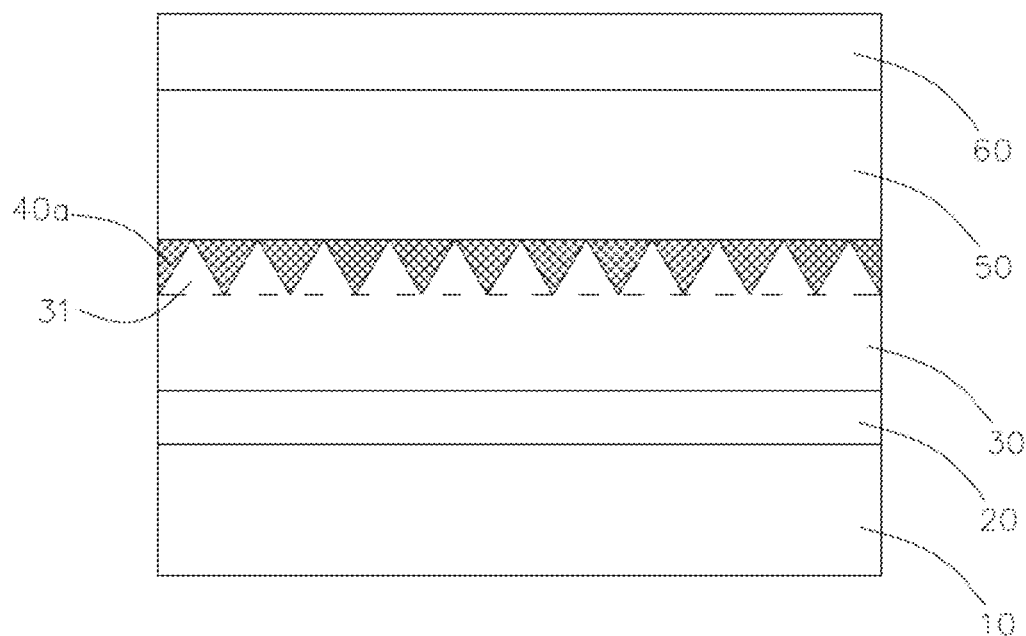
FIG. 4 is a schematic cross-sectional view of a LED structure according to an implementation of the present disclosure.

FIG. 4 illustrates a LED structure according to an implement of the present disclosure. As illustrated in FIG. 4, the LED structure includes a substrate 10, a buffer layer 20, a first type semiconductor layer 30, an MQW light-emitting layer 40a, a second type semiconductor layer 50, and a transparent conductive layer 60. The LED structure illustrated in FIG. 4 is similar to the LED structure illustrated in FIG. 1, except that in the MQW light-emitting layer 40 illustrated in FIG. 1, the surface of the first thickness region 41 away from the patterned structure layer 31 and the surface of the transition region 43 away from the patterned structure layer 31 cooperate to define the depression toward the patterned structure layer 31, while in the MQW light-emitting layer 40a illustrated in FIG. 4, the surface of the first thickness region 41 away from the patterned structure layer 31 and the surface of the transition region 43 away from the patterned structure layer 31 cooperate to form a flat surface. Further, the MQW light-emitting layer 40a between two adjacent cones 310 has a cross section in part in a triangular shape. In this implementation, the thickness of the transition region 43 decreases linearly in the direction from the first thickness region 41 to the second thickness region 42, and the amount of variation in the thickness of the transition region 43 is larger than that of the transition region 3 illustrated in FIG. 1, resulting in a simpler manufacturing process.

Figure 5:
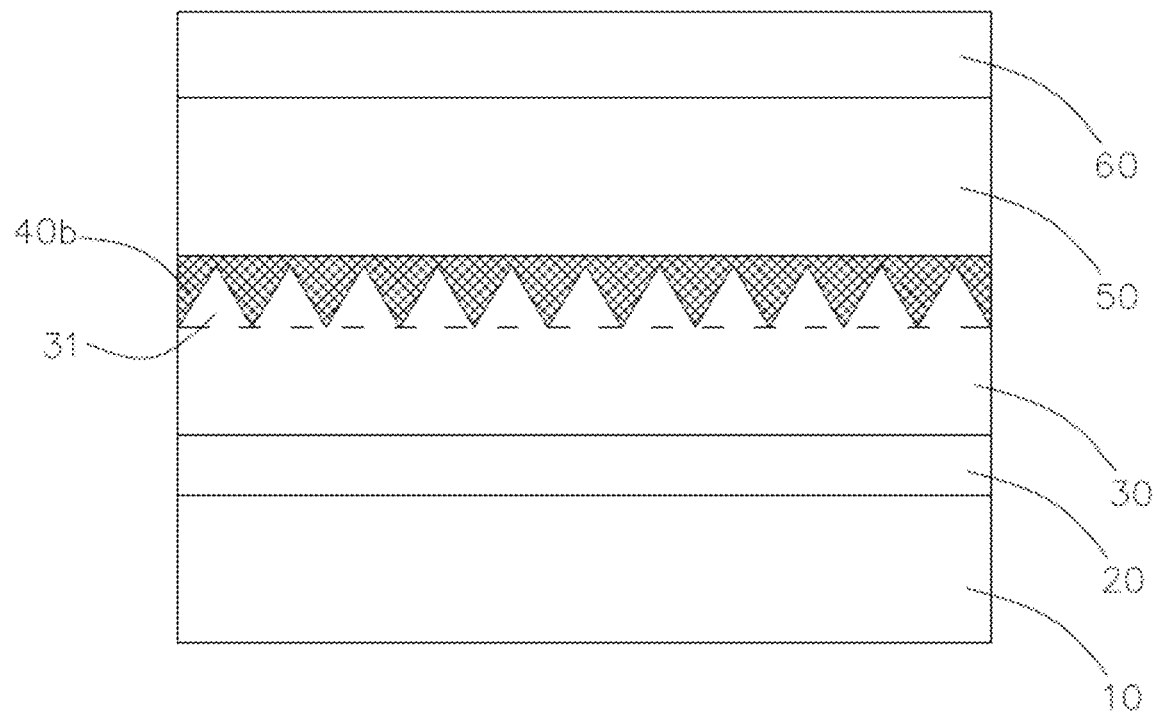
FIG. 5 is a schematic cross-sectional view of a LED structure according to an implementation of the present disclosure.

FIG. 5 illustrates a LED structure according to an implement of the present disclosure. The LED structure includes a substrate 10, a buffer layer 20, a first type semiconductor layer 30, an MQW light-emitting layer 40b, a second type semiconductor layer 50, and a transparent conductive layer 60. The LED structure illustrated in FIG. 5 is similar to the LED structure illustrated in FIG. 4, except that the second thickness region 42 of the MQW light-emitting layer 40a illustrated in FIG. 4 is very close to the peak of the cone 310 at one side of the second thickness region 42 that is away from the patterned structure layer 31, while the second thickness region 42 of the MQW light-emitting layer 40b illustrated in FIG. 5 is separated from the peak of the cone 310 by a certain distance at one side of the second thickness region 42 that is away from the patterned structure layer 31. Of course, the thickness of the first thickness region 41 is still at least twice that of the second thickness region 42.

Figure 6:
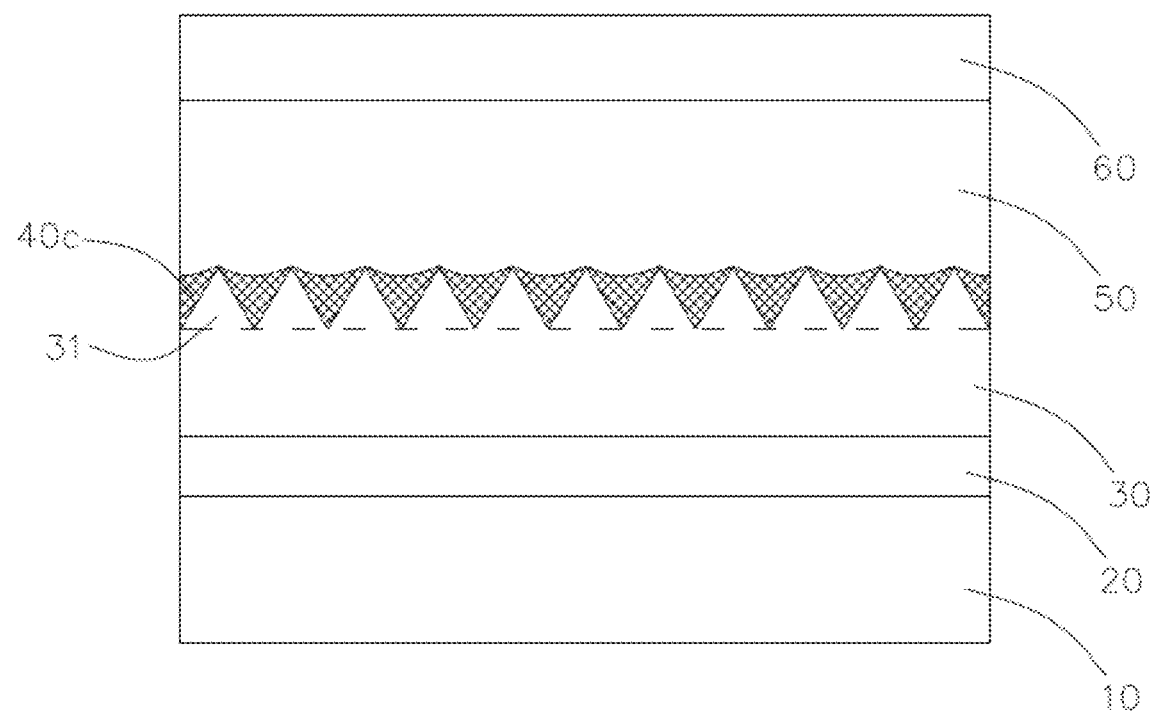
FIG. 6 is a schematic cross-sectional view of a LED structure according to an implementation of the present disclosure.

FIG. 6 illustrates a LED structure according to an implement of the present disclosure. As illustrated in FIG. 6, the LED structure includes a substrate 10, a buffer layer 20, a first type semiconductor layer 30, an MQW light-emitting layer 40c, a second type semiconductor layer 50, and a transparent conductive layer 60. The LED structure illustrated in FIG. 6 is similar to the LED structure illustrated in FIG. 1, except that in the MQW light-emitting layer 40 illustrated in FIG. 1, the surface of the first thickness region 41 away from the patterned structure layer 31 and the surface of the transition region 43 away from the patterned structure layer 31 cooperate to define the depression having a V-shaped cross-section toward the patterned structure layer 31, while in the MQW light-emitting layer 40c illustrated in FIG. 6, the surface of the first thickness region 41 away from the patterned structure layer 31 and the surface of the transition region 43 away from the patterned structure layer 31 cooperate to define the depression having an arc-shaped cross-section toward the patterned structure layer 31.

Figure 7:
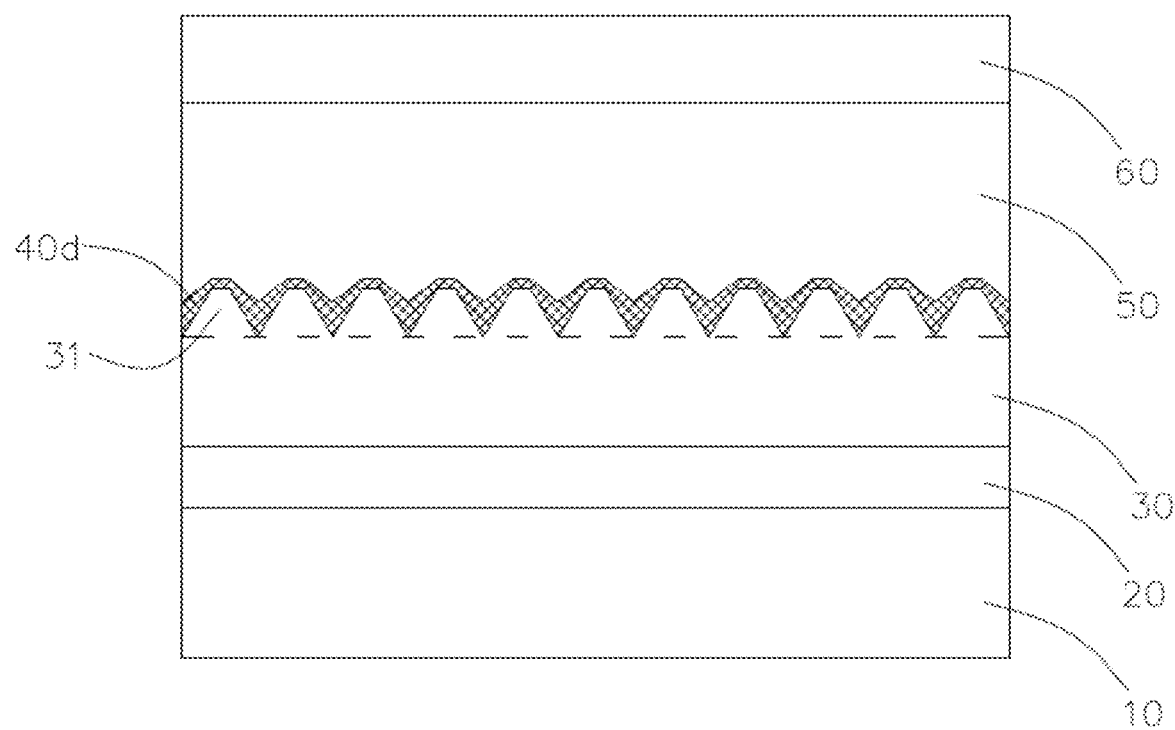
FIG. 7 is a schematic cross-sectional view of a LED structure according to an implementation of the present disclosure.

FIG. 7 illustrates a LED structure according to an implement of the present disclosure. As illustrated in FIG. 7, the LED structure includes a substrate 10, a buffer layer 20, a first type semiconductor layer 30, an MQW light-emitting layer 40d, a second type semiconductor layer 50, and a transparent conductive layer 60. The LED structure illustrated in FIG. 7 is similar to the LED structure illustrated in FIG. 1, except that in FIG. 1 the peak of the cone 310 is pointed and the second thickness region 42 of the MQW light-emitting layer 40 is pointed, while in FIG. 7 the peak of the cone 310 is flat and the second thickness region 42 of the MQW light-emitting layer 40d is flat. In this implementation, it is only necessary to ensure that the thickness of the first thickness region 41 is greater than that of the second thickness region 42.

The technical features of the above-mentioned implementations can be combined arbitrarily. For simplicity, not all possible combinations of the various technical features in the above-mentioned implementations are described. However, as long as there is no contradiction in the combination of these technical features, it should be regarded as falling within the scope of this specification.

The above-mentioned implementations merely present several specific and detailed implementations, but it should not be understood as a limitation on the protection scope of the present disclosure. It is noted that, without departing from the concept of the present disclosure, various modifications and improvements shall be readily appreciated by those skilled in the art and within the protection scope of the disclosure. Therefore, the protection scope of the disclosure shall be subject to the protection scope of the claims.

What is claimed is:

1. A light emitting diode (LED) structure, comprising:
   a substrate;
   a first type semiconductor layer disposed on the substrate and having a patterned structure layer on a surface of the first type semiconductor layer away from the substrate;
   a second type semiconductor layer; and
   a multi-quantum well light-emitting layer sandwiched between the patterned structure layer and the second type semiconductor layer and covering the patterned structure layer;
   the multi-quantum well light-emitting layer having a plurality of first thickness regions, a plurality of second thickness regions, and a plurality of transition regions each connected between a corresponding one of the plurality of first thickness regions and a corresponding one of the plurality of second thickness regions;
   the plurality of first thickness regions and the plurality of second thickness regions being alternately arranged;
   each of the plurality of first thickness regions having a thickness greater than each of the plurality of second thickness regions in a direction from the first type semiconductor layer to the second type semiconductor layer; and
   each of the plurality of transition regions having a thickness that gradually decreases in a direction from a corresponding one of the plurality of first thickness regions to a corresponding one of the plurality of second thickness regions;
   wherein
   the patterned structure layer comprises a plurality of cones, and each of the plurality of first thickness regions is located between two adjacent cones; and
   for each of the plurality of first thickness regions, a surface of the first thickness region away from the patterned structure layer in the direction from the first type semiconductor layer to the second type semiconductor layer and one cone connected to the first thickness region have a first distance therebetween in the direction from the first type semiconductor layer to the second type semiconductor layer, a surface of the transition region, connected to the first thickness region, away from the patterned structure layer in the direction from the first type semiconductor layer to the second type semiconductor layer and the one cone have a second distance therebetween in the direction from the first type semiconductor layer to the second type semiconductor layer, and a surface of the second thickness region, connected to the transition region, away from the patterned structure layer in the direction from the first type semiconductor layer to the second type semiconductor layer and the one cone have a third distance therebetween in the direction from the first type semiconductor layer to the second type semiconductor layer, wherein the first distance, the second distance, and the third distance decrease in sequence.

2. The LED structure of claim 1, wherein the thickness of each of the plurality of first thickness regions is at least twice that of each of the plurality of the second thickness regions.

3. The LED structure of claim 1, wherein the thickness of each of the plurality of first thickness regions is at least 5.5 times that of each of the plurality of the second thickness regions.

4. The LED structure of claim 1, wherein the thickness of each of the plurality of transition regions decreases linearly in the direction from the corresponding one of the plurality of first thickness regions to the corresponding one of the plurality of second thickness regions.

5. The LED structure of claim 1, wherein the plurality of first thickness regions are close to a bottom of the patterned structure layer, and the plurality of the second thickness regions are close to a top of the patterned structure layer.

6. The LED structure of claim 1, wherein
   the plurality of cones cooperate to form a plurality of peaks and valleys; and
   each of the plurality of second thickness regions is located at the peak of a corresponding one of the plurality of cones, wherein the peak is close to the second type semiconductor layer.

7. The LED structure of claim 6, wherein each of the plurality of second thickness regions has one side away from the patterned structure layer, and the one side is spaced apart from the peak of a corresponding one of the plurality of cones.

8. The LED structure of claim 6, wherein the peak of each of the plurality of cones is pointed, and each of the plurality of second thickness regions is pointed.

9. The LED structure of claim 6, wherein the peak of each of the plurality of cones is flat, and each of the plurality of second thickness regions of the multi-quantum well light-emitting layer is flat.

10. The LED structure of claim 1, wherein the surface of each of the plurality of first thickness regions away from the patterned structure layer in the direction from the first type semiconductor layer to the second type semiconductor layer and the surface of a corresponding one of the plurality of transition regions away from the patterned structure layer in the direction from the first type semiconductor layer to the second type semiconductor layer cooperate to define a depression toward the patterned structure layer.

11. The LED structure of claim 10, wherein the depression of the multi-quantum well light-emitting layer has a V-shaped cross section.

12. The LED structure of claim 10, wherein the depression of the multi-quantum well light-emitting layer has an arc-shaped cross section.

13. The LED structure of claim 10, wherein the second type semiconductor layer has protrusions at positions corresponding to the depressions of the multi-quantum well light-emitting layer.

14. The LED structure of claim 1, wherein a surface of each of the plurality of first thickness regions away from the patterned structure layer and a surface of a corresponding one of the plurality of transition regions away from the patterned structure layer cooperate to form a flat surface.

15. The LED structure of claim 1, further comprising a buffer layer sandwiched between the substrate and the first type semiconductor layer, the buffer layer being made of undoped N-type gallium nitride.

16. The LED structure of claim 6, wherein bottoms of adjacent cones of the plurality of cones are connected with each other, and tops of adjacent cones of the plurality of cones are spaced apart from each other.

17. The LED structure of claim 1, wherein a projection of the entire multi-quantum well light-emitting layer in the direction from the first type semiconductor layer to the second type semiconductor layer falls on the patterned structure layer.

18. The LED structure of claim 11, wherein a distance between the depression and the cone facing the depression in the direction from the first type semiconductor layer to the second type semiconductor layer is greater than a distance between the second thickness region, connected to the depression, and the cone in the direction from the first type semiconductor layer to the second type semiconductor layer.

19. The LED structure of claim 1, wherein for each two adjacent transition regions, a surface of one of the each two adjacent transition regions away from the first type semiconductor layer is angled relative to a surface of the other of the each two adjacent transition regions away from the first type semiconductor layer by an included angle, and the included angle is an obtuse angle.

20. The LED structure of claim 11, wherein a space between the depression and the cone below the depression in a direction perpendicular to a surface of the cone close to the depression decreases in length in a direction from the first thickness region to the transition region.

* * * * *